(12) United States Patent
Berevoescu et al.

(10) Patent No.: US 6,704,697 B1
(45) Date of Patent: Mar. 9, 2004

(54) UNIFIED TIMING ANALYSIS FOR MODEL INTERFACE LAYOUT PARASITICS

(75) Inventors: Paul Berevoescu, Mountain View, CA (US); Oleg Levitsky, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 09/443,685

(22) Filed: Nov. 18, 1999

(51) Int. Cl.[7] .............................................. G06F 17/50
(52) U.S. Cl. ................. 703/19; 716/4; 716/5; 716/6; 716/18
(58) Field of Search ................ 703/19; 716/4, 716/5, 6, 18

(56) References Cited

U.S. PATENT DOCUMENTS

| | | | | |
|---|---|---|---|---|
| 5,452,239 A | * | 9/1995 | Dai et al. ...................... | 703/19 |
| 5,740,347 A | | 4/1998 | Avidan ................... | 395/183.09 |
| 5,790,830 A | | 8/1998 | Segal .......................... | 395/500 |
| 6,023,568 A | * | 2/2000 | Segal .......................... | 716/6 |
| 6,212,492 B1 | * | 4/2001 | Kuge .......................... | 703/15 |
| 6,286,126 B1 | * | 9/2001 | Raghavan et al. ............. | 716/6 |
| 6,418,401 B1 | * | 7/2002 | Dansky et al. ................. | 703/27 |
| 6,438,729 B1 | * | 8/2002 | Ho ................................ | 716/1 |

OTHER PUBLICATIONS

Julian Culetu, Chaim Amir, John MacDonald, "A Practical Repeater Insertion Method in High Speed VLSI Circuits", 1998 ACM, Page(s) 392–395.*

* cited by examiner

Primary Examiner—Hugh Jones
Assistant Examiner—Dwin Craig
(74) Attorney, Agent, or Firm—Bever, Hoffman & Harms, LLP; Jeanette S. Harms

(57) ABSTRACT

A modeling method to improve the accuracy of timing analysis that more closely models timing information associated with layout parasitics that are connected to interface pins of a transistor-level subcircuit. A method is described for performing a hierarchical timing analysis of a circuit having a transistor-level subcircuit. Certain data (e.g., the layout parasitic data associated with interface nodes) associated with the transistor-level subcircuit are set aside. A timing model (timing arcs) of the transistor-level subcircuit is created without using these data. The timing analysis of the circuit is performed using a circuit analyzer. The circuit analyzer uses the timing model (timing arcs) and the layout parasitic data for the transistor-level subcircuit in the timing analysis. Thus, the layout parasitic data associated with the lower level subcircuit is preserved and used in the higher level circuit timing analysis to provide an accurate non-linear timing analysis of the layout parasitics.

21 Claims, 10 Drawing Sheets

UNIFIED TIMING ANALYSIS FOR MODEL INTERFACE LAYOUT PARASITICS

TECHNICAL FIELD

The present invention relates to the field of electronic design automation and circuit timing analysis models. In particular, the present invention pertains to the application of layout parasitic data in a hierarchical timing analysis.

BACKGROUND ART

Integrated circuits can be represented as netlists within electronic design automation systems. A circuit timing analyzer takes a netlist of a circuit and the associated timing information for a circuit, and abstracts them to get a timing representation ("model") of the circuit. The timing model is then used by a circuit analyzer to estimate the overall performance of the circuit, identify critical paths in the circuit, and find timing violations. Prior art circuit analyzers are described by U.S. Pat. No. 5,740,347, entitled "Circuit Analyzer of Black, Gray and Transparent Elements," by Jacob Avidan, issued Apr. 14, 1998, and by U.S. Pat. No. 5,790,830, entitled "Extracting Accurate and Efficient Timing Models of Latch-Based Designs," by Russell B. Segal, issued Aug. 4, 1998, herein incorporated by reference in their entirety.

For analysis purposes, a circuit can be considered as a collection of interconnected functional blocks. A functional block includes the collection of hardware components that make up the circuit as well as the software structures used to represent the circuit, such as nodes (a node being a point of connectivity, including an input or output of the circuit). The circuit can be specified hierarchically, with higher level functional blocks encompassing one or more lower level blocks. A higher level functional block may be a subcircuit composed of other lower level functional blocks that may also be subcircuits. The more the circuit is abstracted, the lower the accuracy of the models becomes.

To facilitate the design and analysis of a complex circuit, a hierarchical timing analysis is typically performed. At the highest level of the hierarchy, the overall circuit is analyzed using a multiplicity of integrated timing models that each represent a functional block at the next lower level. Each of these functional blocks is in turn composed of a multiplicity of timing models that each represent a functional block at the next lower level, and so on.

In practice, the timing models are typically created starting at the lowest level of the circuit, from there proceeding level-by-level to the highest level. Each lowest level functional block is designed and analyzed. A timing model is created for each lowest level functional block and these timing models are fed to the next higher level, where the models are integrated and an analysis is performed of an integrated mid-level functional block. Other mid-level functional blocks are similarly formed and analyzed. Each of the mid-level blocks is then represented by a timing model which is fed to the next higher analysis level, and so on until at the highest level the overall circuit can be assembled and analyzed using a multiplicity of integrated timing models each representing relatively large functional blocks.

Prior Art FIG. 1A illustrates a plurality of functional blocks (blocks A, B, C and D) located within a larger functional block 10 (at the highest level, functional block 10 can represent the entire integrated circuit). By way of example, a single wire is shown connecting block A 20 and block D 30. For the purposes of this discussion, the wire is divided into three segments: segment 40a is within block A 20, segment 40b runs between block A 20 and block D 30, and segment 40c is within block D 30.

Blocks A 20 and D 30 (as, well as blocks B and C) are each represented by a timing model. In the prior art, the timing model of the timing arc for block A 20 incorporates the "raw" layout parasitic data (e.g., R and C) for that block, including that for wire segment 40a. In other words, the layout parasitics are considered when generating the timing arcs for block A 20. The layout parasitics are modeled linearly and incorporated into the timing arc model of block A 20. Similarly, the timing model for block D 30 incorporates the effects of the layout parasitic data for that block, including that for wire segment 40c. As described above, in a hierarchical timing analysis, these timing models are integrated with the other timing models in a circuit analyzer in order to perform the timing analysis at the next highest level (that is, at the level of functional block 10). In the prior art, wire segment 40b is incorporated into the timing analysis at the level of functional block 10.

The prior art is problematic when the lower level models are used in an analysis at a higher level in the hierarchical timing analysis, because the higher level timing analysis has its own layout parasitic data. As a result, the wire from block A 20 to block D 30 inherently has a dual modeling. That is, the parts of the wire inside the lower level timing models (e.g., segments 40a and 40c) are represented linearly (using, for example, a lookup table) while the part of the wire in the higher level timing model, outside the lower level models (e.g., segment 40b), is represented nonlinearly using raw layout parasitic data. Adding the linear representations and the nonlinear representation can yield inaccurate results; this loss of accuracy is particularly acute at lower levels in the timing analysis, where the circuit size is smaller. Thus, a disadvantage to the prior art is that the duality in the models, with regard to the different treatment of layout parasitic data inside and outside of the timing models, can reduce accuracy in the timing analysis.

Prior Art FIG. 1B illustrates an exemplary higher level block (e.g., circuit 50) which includes a lower level block (e.g., subcircuit 55) that is at the transistor level of a circuit. Layout parasitic data are represented by a combination of resistors and capacitors (e.g., 60a, 60b, 61a, 61b, 62a, 62b, 63a, 63b, 64a and 64b). For an analysis at the transistor level, inverter 56 drives the gates of transistors 57, 58 and 59 through the netlist described by 60a, 60b, 61a, 61b, 62a, 62b, 63a, 63b, 64a and 64b. For a hierarchical timing analysis, in the model for subcircuit 55 (represented using dashed lines as model 70), inverter 56 drives pin 65 through the netlist described by 60a and 60b. In this case, a netlist inside model 70 is not visible when running the timing analysis for circuit 50. Instead, the effects of the netlist inside model 70 are incorporated in the model for subcircuit 55. Thus, the layout parasitics that belong to circuit 50 are analyzed differently than the layout parasitics that belong to model 70, introducing accuracy problems in the timing analysis.

In addition, when a circuit analyzer is applied at the transistor level of a circuit (that is, at the lowest level in the hierarchy of the timing analysis), a higher level of accuracy is desired for the circuit analysis. Therefore, a reduction in accuracy due to the prior art technique for modeling layout parasitics at the interface pins is particularly undesirable at the transistor level.

Accordingly, a need exists to resolve the modeling duality caused by the treatment of layout parasitic data at a lower level versus a higher level of a hierarchical timing analysis. A need also exists for a device or method that can be utilized at the transistor level. The present invention solves these needs. These and other objects and advantages of the present invention will become clear to those of ordinary skill in the art in light of the following detailed description of the preferred embodiments which are illustrated in the various drawing figures.

DISCLOSURE OF THE INVENTION

The present invention provides a method of generating timing models that addresses the modeling duality caused by the treatment of layout parasitic data at the lower and higher levels in a hierarchical timing analysis. The present invention also provides a method and timing model that can be utilized at the transistor level.

The present invention pertains to a modeling method to improve the accuracy of a circuit timing analysis that more closely models timing information associated with layout parasitics that are connected to interface nodes of a transistor-level subcircuit. The modeling method is for performing a hierarchical timing analysis of a circuit that can include a transistor-level subcircuit.

In the present embodiment, for the timing analysis, a circuit is separated into a higher level block and a lower level block, where the higher level block and the lower level block are mutually exclusive. Certain data (e.g., the layout parasitic data associated with the interface pins or the "interface small nodes") of the lower level block are set aside. A timing model (timing arc or timing arcs) for the lower level block is created without using these data; that is, one or more timing arcs are generated without using the layout parasitic data connected to the interface pins or the interface small nodes (collectively, the "interface nodes"). The resultant model of the lower level block then includes the timing arcs plus the raw layout parasitic data. This resultant model is then passed up to the timing analysis performed for the next higher level in the hierarchical timing analysis. As a result, the timing analysis of the higher level block is performed with a circuit analyzer that uses the timing model and the layout parasitic data for the interface nodes in the lower level block. Thus, the layout parasitic data associated with the interface nodes in the lower level subcircuit are preserved and used in the higher level circuit timing analysis to provide an accurate non-linear timing analysis of the layout parasitics.

At the lowest level of the hierarchy, the lower level block can comprise one or more transistors.

In one embodiment, the layout parasitic data are represented in the spf format.

In one embodiment, the capacitances for the interface small nodes of the lower level block are saved.

Thus, the layout parasitic data associated with an interface node of a lower level of a circuit (including, for example, the transistor level) are preserved and used in the next higher level circuit timing analysis. The layout parasitics are therefore uniformly modeled along the entire length of, for example, a wire segment, including the interface pins that connect timing models. A non-linear timing computation can be used for the wire segment, improving the overall accuracy of the timing analysis.

BRIEF DESCRIPTION OF THE DRAWINGS

The accompanying drawings, which are incorporated in and form a part of this specification, illustrate embodiments of the invention and, together with the description, serve to explain the principles of the invention.

PRIOR ART

PRIOR ART

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. A procedure, logic block, process, etc. is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, bytes, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "separating" or "creating" or "performing" or "isolating" or the like, refer to the action and processes of a computer system (e.g., the processes of FIGS. 6, 7A, 7B and 7C), or similar electronic computing device, that manipulates and transforms data represented as physical (electronic) quantities within the computer system's registers and memories into other data similarly represented as physical quantities within the computer system memories or registers or other such information storage, transmission or display devices.

Figure 2:
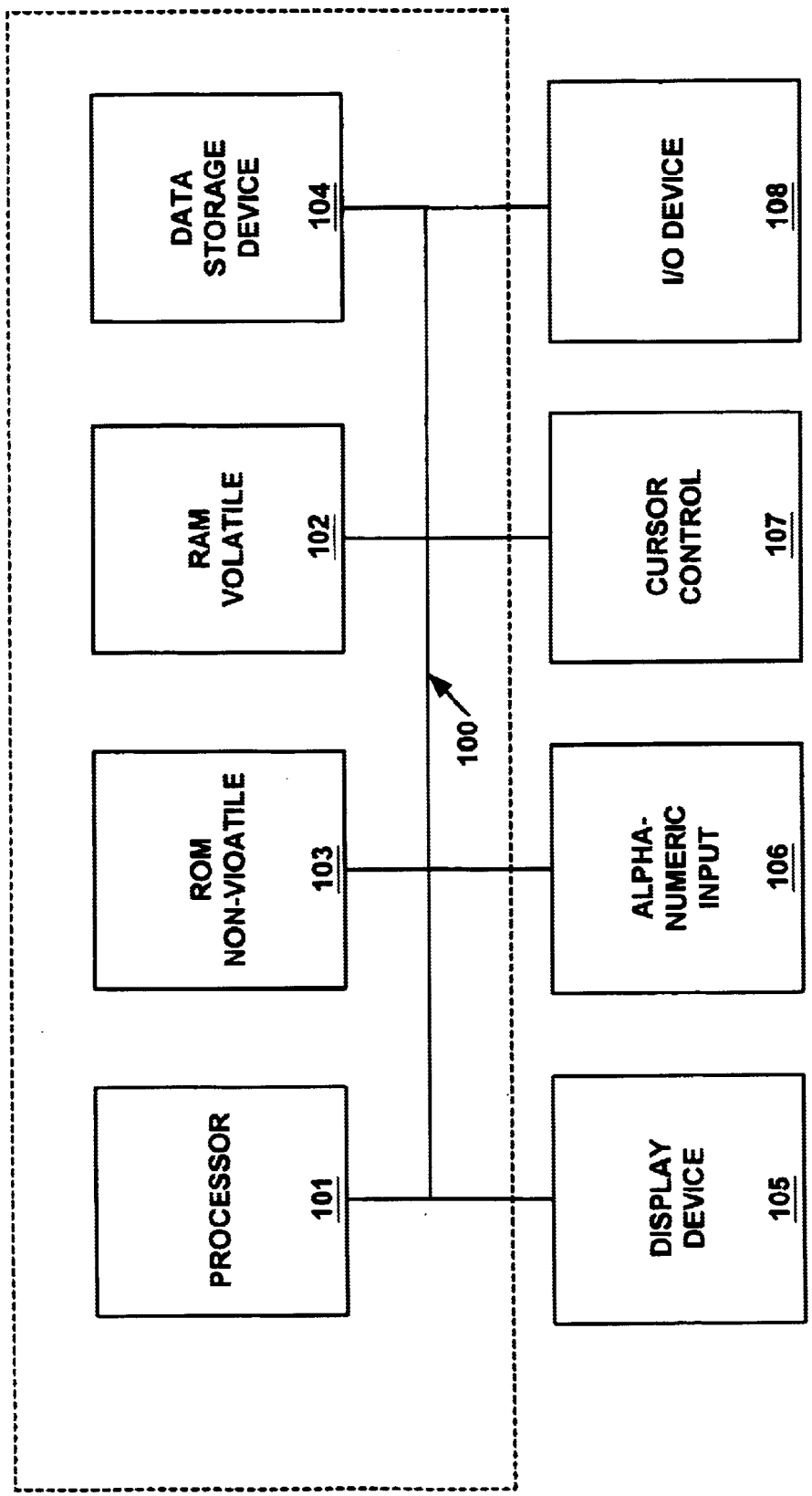
FIG. 2 is a block diagram of an exemplary computer system upon which embodiments of the present invention may be practiced.

Refer now to FIG. 2, which illustrates an exemplary computer system 190 upon which embodiments of the present invention may be practiced. In general, computer system 190 comprises bus 100 for communicating information, processor 101 coupled with bus 100 for processing information and instructions, random access (volatile) memory 102 coupled with bus 100 for storing information and instructions for processor 101, read-only (non-volatile) memory 103 coupled with bus 100 for storing static information and instructions for processor 101, data storage device 104 such as a magnetic or optical disk and disk drive coupled with bus 100 for storing information and instructions, an optional user output device such as display device 105 coupled to bus 100 for displaying information to the computer user, an optional user input device such as alphanumeric input device 106 including alphanumeric and function keys coupled to bus 100 for communicating information and command selections to processor 101, and an optional user input device such as cursor control device 107 coupled to bus 100 for communicating user input information and command selections to processor 101. Furthermore, an optional input/output (I/O) device 108 is used to couple the computer system 190 onto, for example, a network.

Display device 105 utilized with computer system 190 may be a liquid crystal device, cathode ray tube, or other display device suitable for creating graphic images and alphanumeric characters recognizable to the user. Cursor control device 107 allows the computer user to dynamically signal the two-dimensional movement of a visible symbol (pointer) on a display screen of display device 105. Many implementations of the cursor control device are known in the art including a trackball, mouse, joystick or special keys on alphanumeric input device 106 capable of signaling movement of a given direction or manner of displacement. It is to be appreciated that the cursor control 107 also may be directed and/or activated via input from the keyboard using special keys and key sequence commands. Alternatively, the cursor may be directed and/or activated via input from a number of specially adapted cursor directing devices.

The present invention pertains to an electronic design automation method of unified timing analysis for modeling interface layout parasitics in a circuit analyzer. In accordance with the present invention, processor 101 executes the circuit analyzer stored as computer-readable instructions in random access (volatile) memory 102, read-only (non-volatile) memory 103, and/or data storage device 104. The circuit analyzer can be used to estimate the overall performance of a circuit, identify critical paths in the circuit, and find timing violations. In particular, signal propagation timing data can be estimated using a timing analyzer program.

Circuit analyzers are described by U.S. Pat. No. 5,740,347, entitled "Circuit Analyzer of Black, Gray and Transparent Elements," by Jacob Avidan, issued Apr. 14, 1998, and by U.S. Pat. No. 5,790,830, entitled "Extracting Accurate and Efficient Timing Models of Latch-Based Designs," by Russell B. Segal, issued Aug. 4, 1998, herein incorporated by reference in their entirety. However, it is appreciated that the present invention may be implemented using various circuit analyzers.

Figure 3:
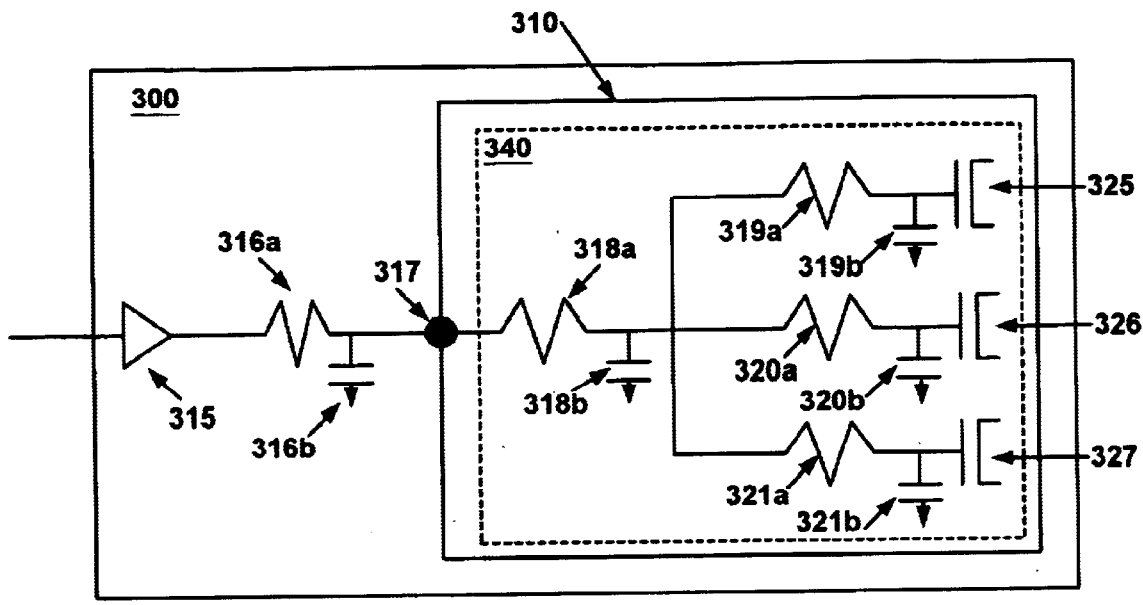
FIG. 3 illustrates one embodiment of a circuit with a transistor-level subcircuit used in a timing analysis in accordance with the present invention.

FIG. 3 illustrates one embodiment of a higher level functional block 300 (e.g., a circuit) including a lower level functional block 310 (e.g., a subcircuit) that can be used in a timing analysis in accordance with the present invention. In the present embodiment, functional block 310 includes transistors 325, 326 and 327. However, it is appreciated that, in a hierarchical analysis of a circuit in accordance with the present invention, functional block 300 can represent any higher level functional block of the circuit and functional block 310 can represent any functional block in the next lower level of the circuit; therefore, in other embodiments, functional block 310 may not include transistors.

Using a technique known in the art, layout parasitics data can be represented in a timing model by a combination of resistors and capacitors (R and C) such as those identified in FIG. 3 as 316a and 316b, 318a and 318b, 319a and 319b, 320a and 320b, and 321a and 321b. The layout parasitic data within functional block 310 are of particular interest, as will be seen, and are collectively referred to as the "interface parasitic ring" (340). In a transistor-level analysis of functional block 300 and functional block 310, inverter 315 drives the gates of transistors 325, 326 and 327. In a hierarchical analysis at the level of functional block 300, functional block 310 is represented by a timing model, and inverter 315 drives interface pin 317 of the timing model for functional block 310.

In accordance with the present embodiment of the present invention, the timing arc(s) of functional block 310 is/are created without considering the layout parasitic data that are connected to the interface pins (e.g., interface pin 317) of the timing model being created. That is, the layout parasitic data included in interface parasitic ring (IPR) 340 are not accounted for when a timing arc is being generated for the timing model for functional block 310.

Instead, the timing model includes the layout parasitic data in "raw" form (that is, in a netlist form, represented by resistors and capacitors). In one embodiment, the layout parasitic data are represented in a known spf format. Subsequently, the higher level timing analysis (e.g., at the level of functional block 300) will use the raw layout parasitic data (e.g., IPR 340) and the timing model for the timing arc of functional block 310. By using the raw layout parasitics, a more accurate, non-linear computation of the timing can be performed using the timing analyzer.

Figure 4:
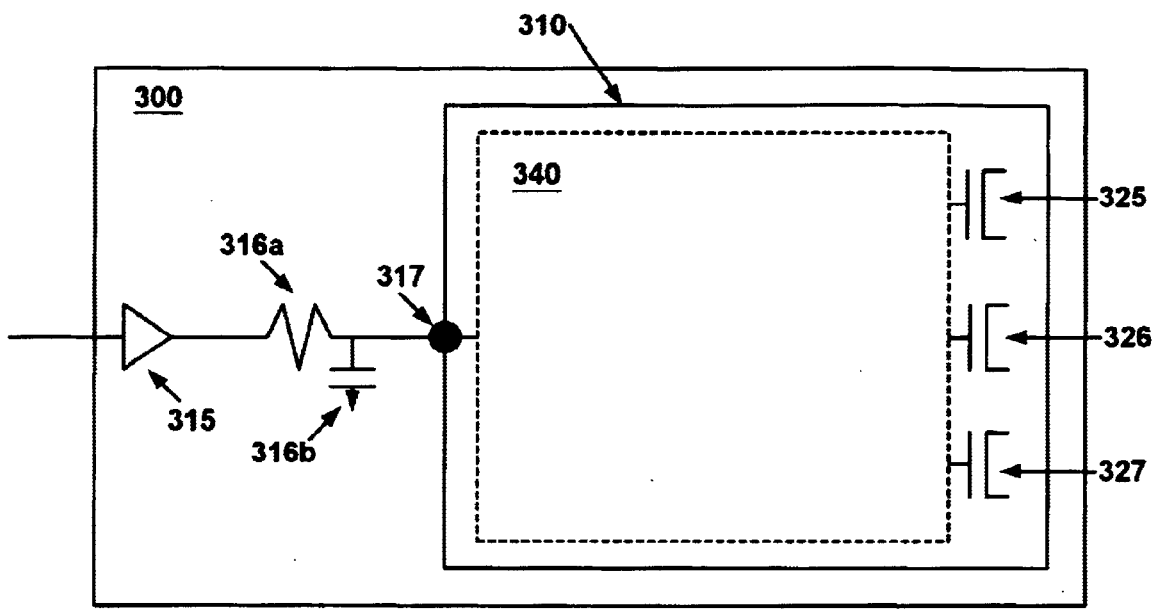
FIG. 4 illustrates the circuit of FIG. 3 in which the subcircuit is represented by a timing model in accordance with one embodiment of the present invention.

FIG. 4 illustrates the circuit of FIG. 3 for a higher level timing analysis (that is, at the level of functional block 300) in accordance with one embodiment of the present invention. For the higher level timing analysis, functional block 310 is a "black box" or "gray box" that is represented using a timing model. In this case, a netlist for functional block 310 is not visible inside the timing model. However, in accordance with the present invention, the effects of the netlist for functional block 310 are incorporated in the model, except for the layout parasitic data (e.g., IPR 340). As described in conjunction with FIG. 3, in accordance with the present embodiment of the present invention, the layout parasitic data of IPR 340 are not considered when the timing model (timing arc) for functional block 310 is created. Instead, the layout parasitic data of IPR 340 are separated from functional block 310 and saved as raw data. The raw layout parasitic data are provided to the higher level analysis at the level of functional block 300 along with but separate from the timing arcs for functional block 310.

Thus, for example, the layout parasitics of a wire that has a segment in functional block 300 and a segment in functional block 310 are represented uniformly in the higher level timing analysis at the level of functional block 300. Accordingly, the overall accuracy of the timing analysis can be improved. In addition, the accuracy at interface pin 317 can also be improved; for example, there will not be a discontinuity at the interface pin because the layout parasitics of the wire are uniformly (e.g., non-linearly) modeled on both sides of the interface pin.

Figure 5:
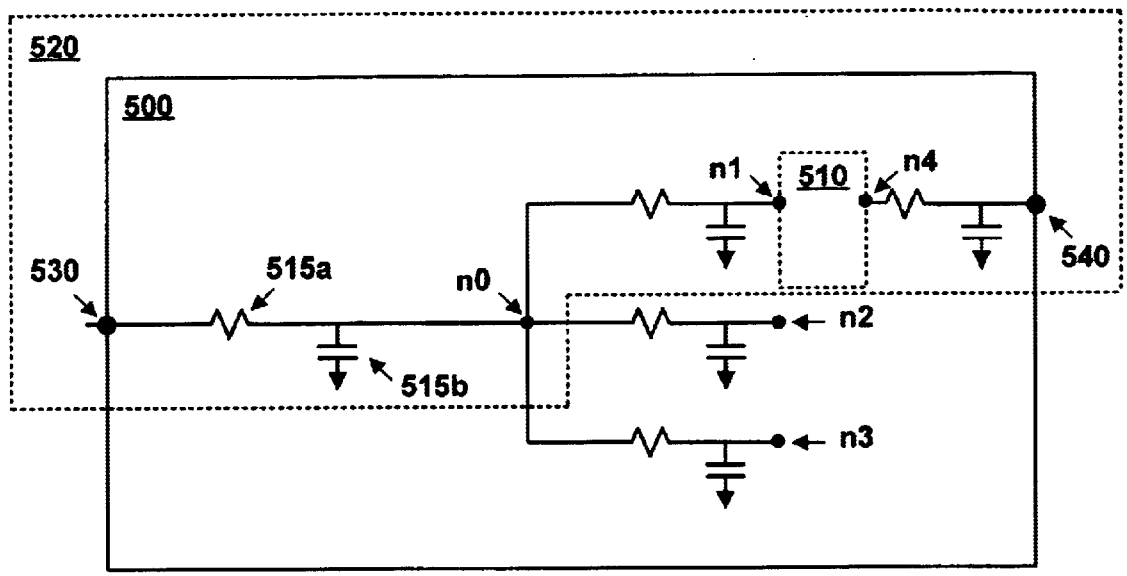
FIG. 5 illustrates one embodiment of a subcircuit with internal nodes used in a timing analysis in accordance with the present invention.

FIG. 5 illustrates another embodiment of a functional block 500 (e.g., a circuit or subcircuit) in accordance with the present invention. Functional block 500 may be a lower level functional block within a higher level functional block (not shown). Layout parasitic data inside functional block 500 are represented using resistors and capacitors exemplified by 515a and 515b. The timing model for functional block 500 includes timing arc 520 starting at interface pin 530 and ending at interface pin 540. The box labeled 510 ("subcircuit 510") represents, for example, a subcircuit comprising either one or more transistors or a functional block from a lower level in the hierarchical timing analysis.

Continuing with reference to FIG. 5, functional block 500 has internal nodes n0, n1, n2, n3 and n4. In general, a node is a point of connectivity, including an input or output of the circuit, that is typically coupled to one or more other nodes in the circuit timing model. "Interface small nodes" are, in general, those nodes connected to an interface pin of the timing model, an internal model pin, a subcircuit, a transistor, a circuit element, or the like. Thus, nodes n1 and n4, for example, are each interface small nodes because they are connected to subcircuit 510. Nodes n2 and n3 are also interface small nodes, if connected to an interface pin, an internal model pin, a subcircuit, a transistor, a circuit element, or the like (not shown). Node n0 is not an interface small node because it is not connected to a circuit element, etc.

In one embodiment, each transition (rise-rise, rise-fall, fall-rise, and fall-fall for delay time, setup time or hold time) of a timing arc (e.g., timing arc 520) which starts or ends at an interface pin (e.g., interface pins 530 and/or 540) with layout parasitic data will have the following information attached to it:

[small_node_in|small_node_out]=<small node name>.

The meaning of this construct is that the transition of the arc is starting and ending at the small nodes specified.

For example, with reference to FIG. 5, the following syntax is used for timing arc 520 for the maximum and minimum rise-rise and rise-fall delay time transitions:

max_r_r_delay=<timing information and parameters>
small_node_in=n1
small_node_out=n4
max_r_f_delay=<timing information and parameters>
small_node_in=n1
small_node_out=n4
min_r_r_delay=<timing information and parameters>
small_node_in=n1
small_node_out=n4
min_r_f_delay=<timing information and parameters>
small_node_in=n1
small_node_out=n4

In the present embodiment, the capacitances associated with each of the interface small nodes (e.g., n1, n2, n3 and n4) are saved and stored. This is done because typically only the worst-case timing arc for a functional block is saved. Accordingly, there may be one or more interface small nodes (e.g., n2 and n3) that are not associated with a saved timing arc. Thus, an "interface small nodes list" is created and saved for the timing model for a functional block. In one embodiment, the interface small nodes list uses the following syntax:

INTERFACE_SMALL_NODES <small node name><cap=capacitance[fF]>
<small node name><cap=capacitance[fF]>
. . .
<small node name><cap=capacitance[fF]>

For example, with reference to FIG. 5, the following interface small nodes list is created and saved for the timing model for functional block 500 (assuming n2 and n3, as well as n1 and n4, are interface small nodes):

INTERFACE_SMALL_NODES n1 cap=<capacitance [pF]>
n2 cap=<capacitance[pF]>
n3 cap=<capacitance[pF]>
n4 cap=<capacitance[pF]>

Figure 1A:
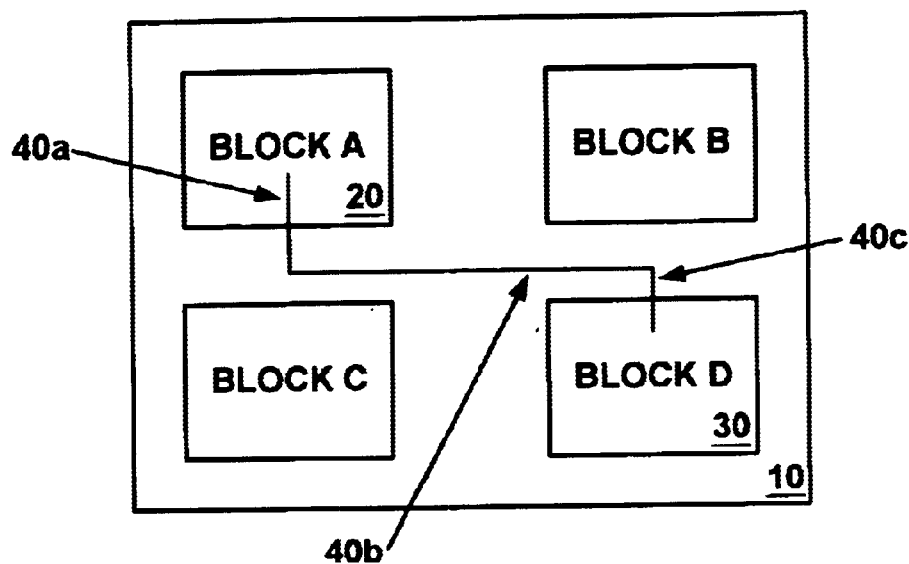
FIG. 1A illustrates a hierarchy of functional blocks used to represent a circuit in accordance with a prior art method for performing timing analyses.
Figure 1B:
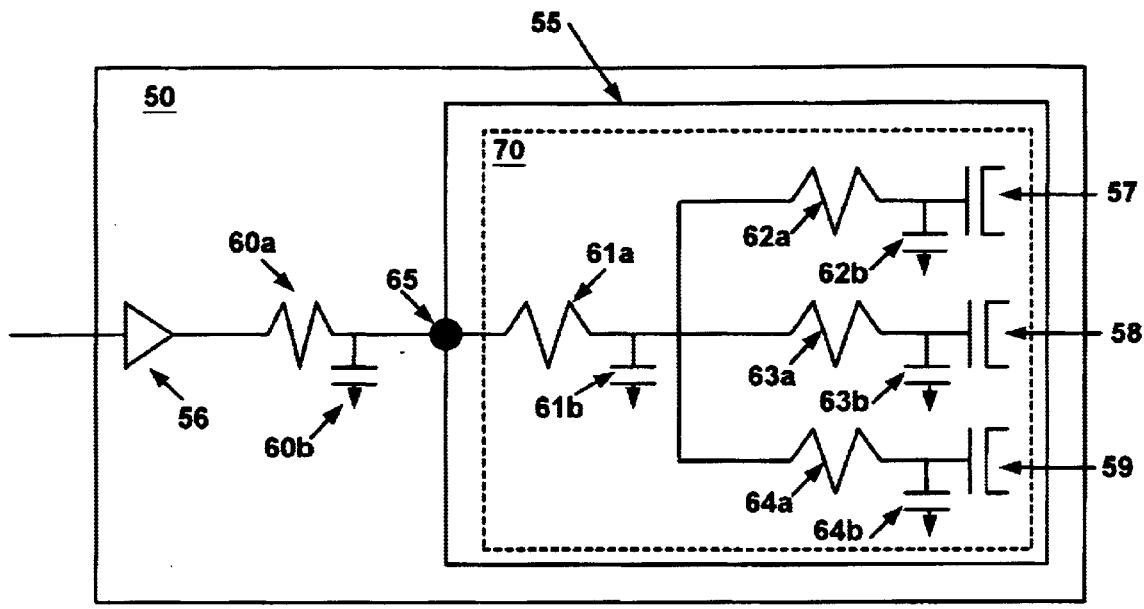
FIG. 1B illustrates an exemplary transistor-level subcircuit used in a prior art timing analysis.
Figure 6:
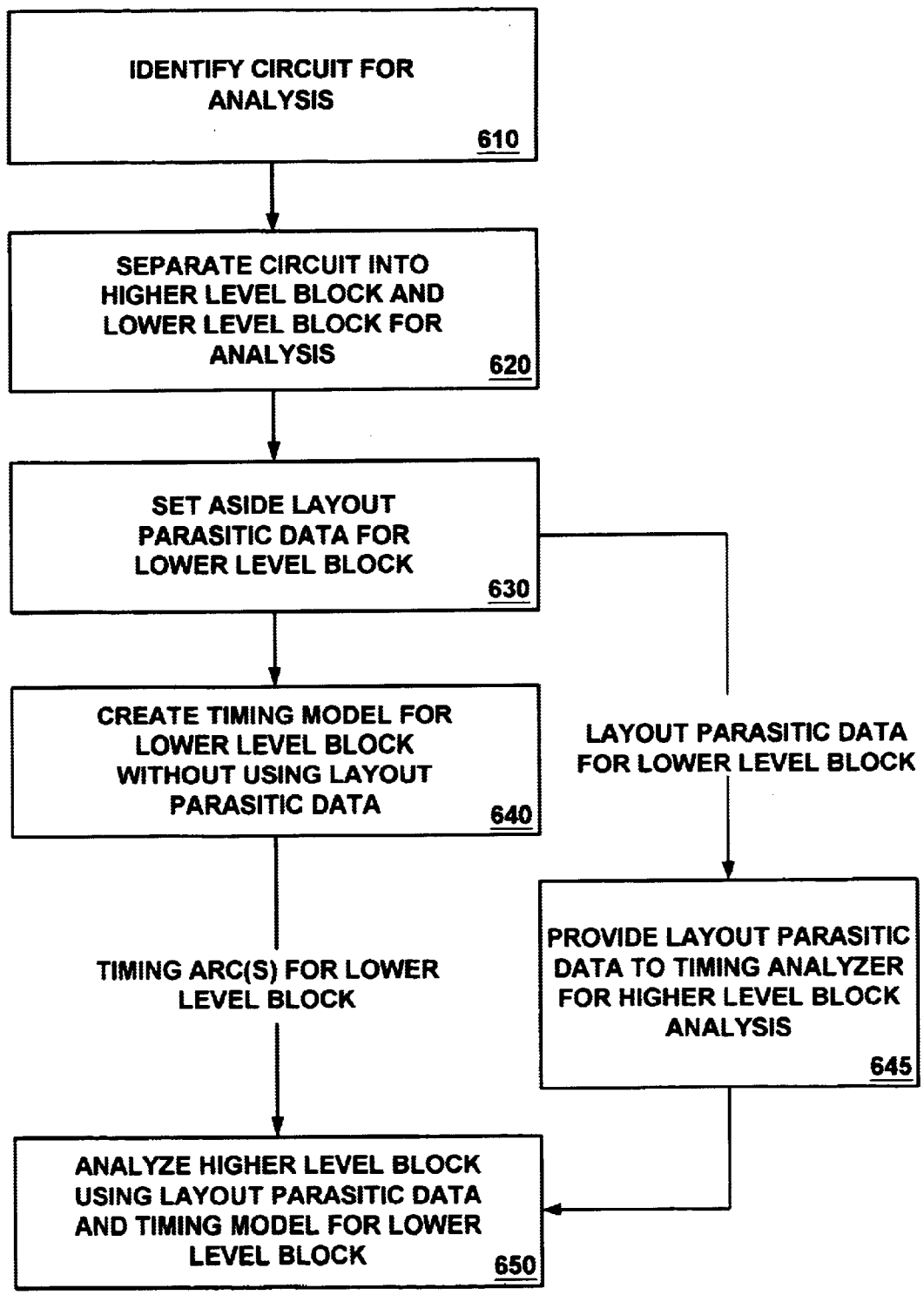
FIG. 6 is a flowchart of the steps in a process for performing a timing analysis in accordance with one embodiment of the present invention.

FIG. 6 is a flowchart of the steps in one embodiment of a process 600 utilized by a circuit analyzer to perform a timing analysis in accordance the present invention. Process 600 is implemented via computer-readable program instructions stored in a memory unit (e.g., random access memory 102, read-only memory 103, and/or data storage device 104) and executed by processor 101 of computer system 190 (FIG. 1).

In step 610 of FIG. 6, the circuit (or portion of a circuit, e.g., a subcircuit) that is to be analyzed is identified using a known method. In a hierarchical timing analysis, the circuit is generally comprised of multiple levels of functional blocks. At the highest level of the hierarchy, the overall circuit is analyzed using a multiplicity of integrated timing models that each represent a functional block at the next lower level. Each of these functional blocks is in turn composed of a multiplicity of timing models that each represent a functional block at the next lower level, and so on. For simplicity of discussion, process 600 is described in the context of a circuit having a higher level block and a lower level block, such as that exemplified by FIGS. 3, 4 and 5. It will be apparent to one of ordinary skill in the art that process 600 can be applied at each of the various levels of a hierarchical timing analysis.

In step 620 of FIG. 6, in one embodiment, the circuit is separated into a higher level functional block (e.g., functional block 300 of FIG. 3) and a lower level functional block (e.g., functional block 310 of FIG. 3) and connected at an interface pin (e.g., interface pin 317 of FIG. 3) using a known method. At the lowest level, functional block 310 can include one or more transistors. Therefore, in this case, the timing analysis being performed is a transistor-level timing analysis.

Similarly, in another embodiment, with reference to FIG. 5, a lower level block 500 is connected at interface pins 530 and 540 to a higher level functional block (not shown) using a known method. In this embodiment, functional block 500 includes interface small nodes n1, n2, n3 and n4.

In step 630 of FIG. 6, in accordance with one embodiment of the present invention, the layout parasitic data connected to an interface pin or an interface small node of the lower level functional block (e.g., functional block 310 of FIG. 3 or functional block 500 of FIG. 5) are isolated and separately stored as raw layout parasitic data. In one embodiment, the data are represented in a spf format.

In step 640 of FIG. 6, in one embodiment of the present invention, the timing model for the lower level functional block (e.g., functional block 310 of FIG. 3 or functional block 500 of FIG. 5) is created without using the associated layout parasitic data connected to an interface pin or a interface small node. That is, for example, the timing arc(s) for functional block 310 are generated without considering the layout parasitic data in IPR 340. Similarly, the timing arc(s) for functional block 500 are created without considering the layout parasitic data attached to nodes n1, n2, n3 and n4 or to interface pins 530 and 540. The timing model (that is, the timing arcs and, separately, the raw parasitic data) for the lower level functional block (e.g., functional block 310 or functional block 500) is provided to the circuit analyzer and used in the timing analysis of the next higher level functional block.

In one embodiment, only the worst case timing arc for functional block 500 is saved. In this embodiment, the capacitances associated with the interface small nodes (FIG. 5) are saved.

In step 645 of FIG. 6, the raw layout parasitic data are retrieved and provided to the circuit analyzer for use in the timing analysis of the next higher level functional block in accordance with one embodiment of the present invention.

In step 650, the timing analysis at the level of the next higher level functional block (e.g., at the level of functional block 300 of FIG. 3) is performed in accordance with the present embodiment of the present invention. This analysis uses the timing arcs for functional block 310 and the raw layout parasitic data for functional block 310. Thus, for example, a wire that has a segment in functional block 300 and a segment in functional block 310 is represented uniformly (e.g., non-linearly) in the higher level timing analysis at the level of functional block 300. The resultant timing computations are more accurate because the layout parasitics are more accurately modeled using a non-linear representation. Accordingly, the overall accuracy of the timing analysis can be improved. In addition, the accuracy at interface pin 317 can also be improved; for example, there will not be a discontinuity at the interface pin because the wire is uniformly modeled on both sides of the interface pin.

Figure 7A:
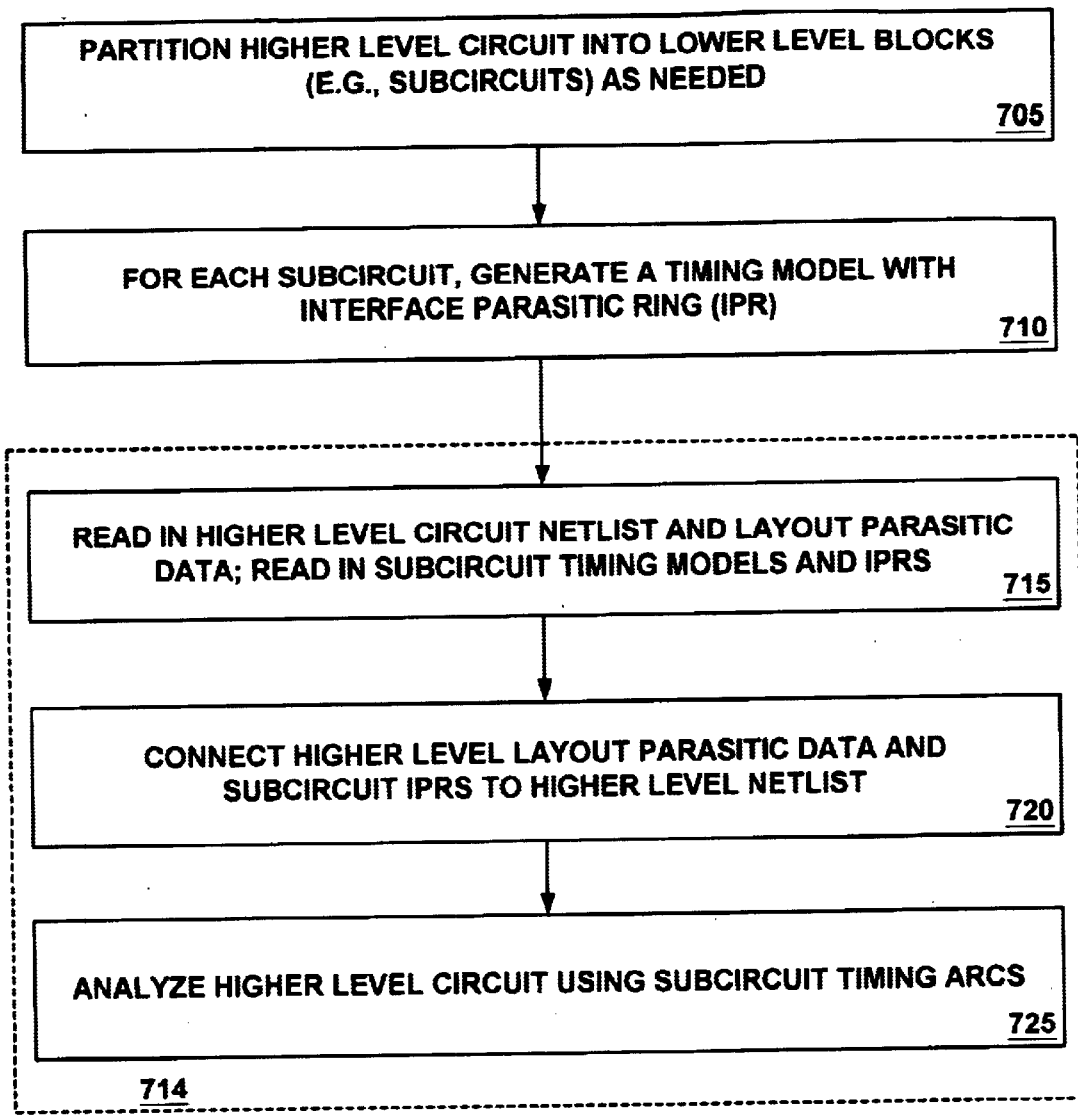
FIGS. 7A, 7B and 7C are flowcharts providing further details of the steps in a process for performing a timing analysis in accordance with one embodiment of the present invention.
Figure 7B:
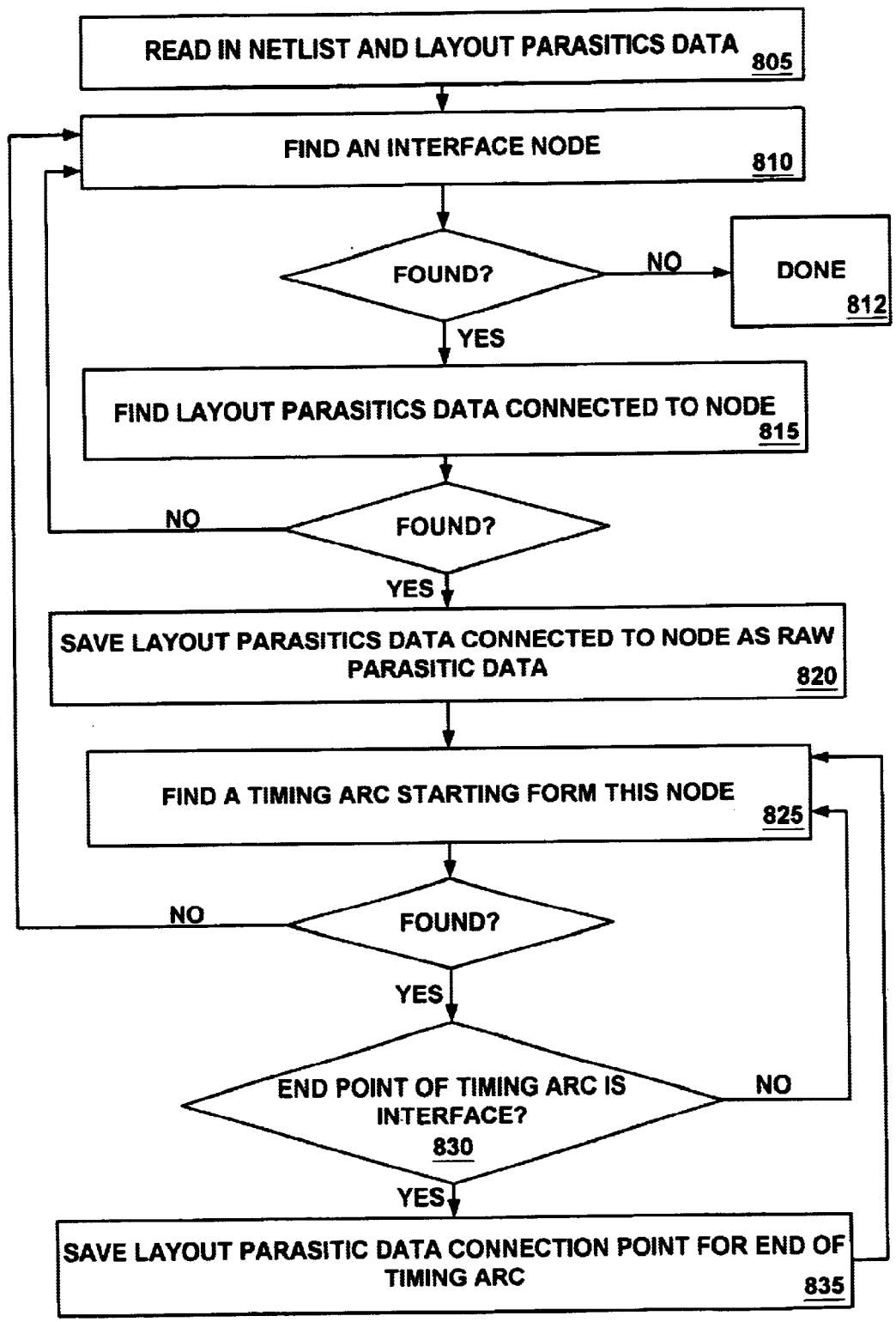
Figure 7C:
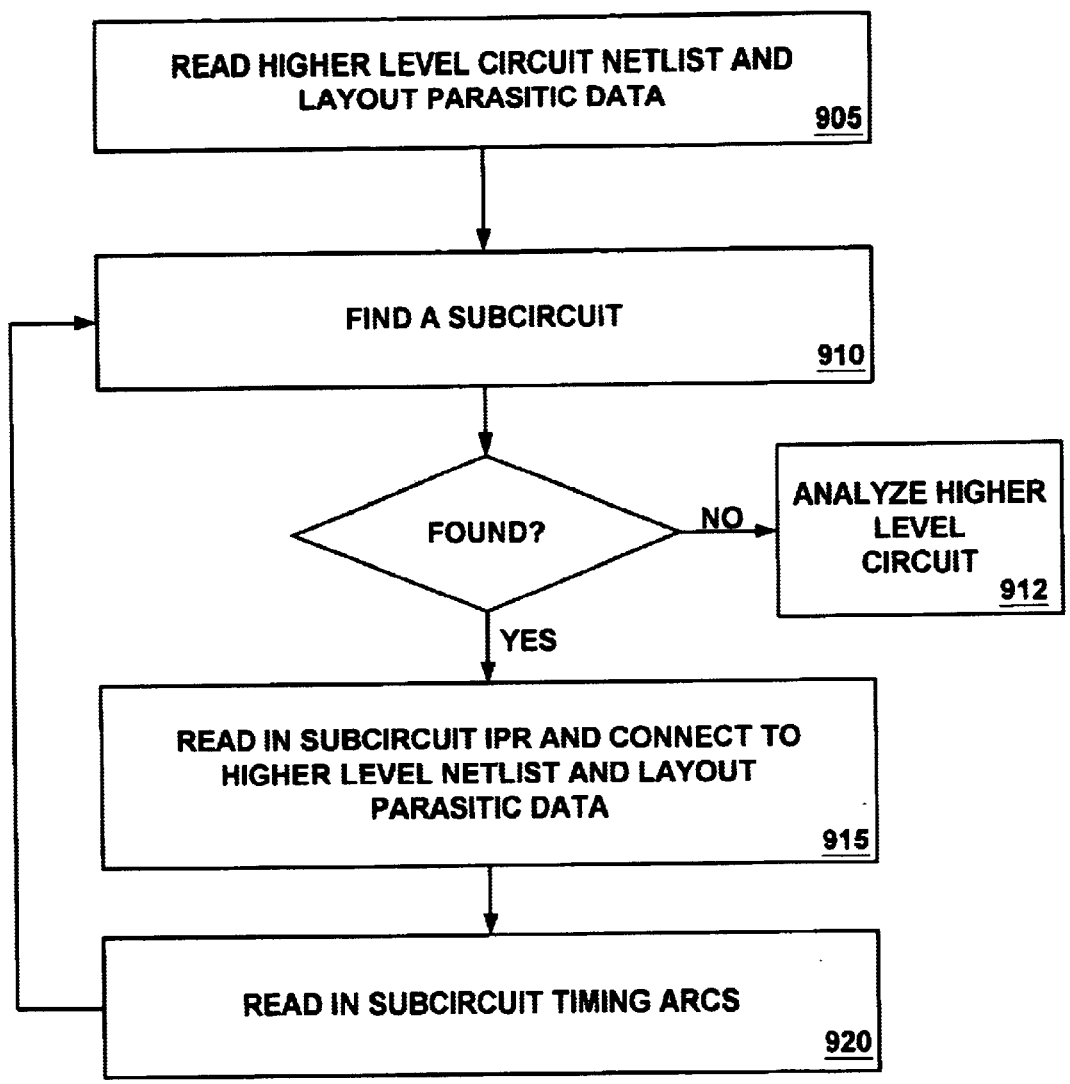

FIGS. 7A, 7B and 7C are flowcharts of the steps of a process 700 utilized by a circuit analyzer for performing a timing analysis in accordance with one embodiment of the present invention. Process 700 is implemented via computer-readable program instructions stored in a memory unit (e.g., random access memory 102, read-only memory 103, and/or data storage device 104) and executed by processor 101 of computer system 190 (FIG. 1). FIG. 7A provides an overview of process 700, FIG. 7B provides additional details regarding step 710 of process 700, and FIG. 7C provides additional details regarding steps 715, 720, and 725 (collectively referred to as block 714) of process 700.

Referring first to FIG. 7A, in step 705, for a hierarchical timing analysis, the higher level circuit (e.g., a higher level functional block such as functional block 300 of FIG. 3) is partitioned into one or more lower level functional blocks (e.g., subcircuits, exemplified by functional block 310 of FIG. 3 or functional block 500 of FIG. 5) using a known method.

In step 710, in accordance with the present embodiment of the present invention, for each of the lower level functional blocks formed in step 705, a timing model with an IPR (e.g., IPR 340 of FIG. 3) is generated and stored in memory (e.g., random access memory 102). Additional information regarding step 710 is provided in conjunction with FIG. 7B.

Continuing with reference to FIG. 7A, in step 715, in the present embodiment, the circuit netlist and the layout parasitic data for the higher level functional block are separately read from memory. In addition, the timing models for each of the lower level functional blocks including the IPRs for each block (step 710) are read from memory.

In step 720, in accordance with the present embodiment of the present invention, the layout parasitic data for the higher level functional block and the timing models including the IPRs for the lower level functional blocks are connected to the netlist for the higher level functional block.

In step 725, the higher level functional block (connected as described in step 720) is analyzed using the timing arcs for the lower level functional blocks.

Refer now to FIG. 7B, which provides additional details regarding step 710 of FIG. 7A in accordance with one embodiment of the present invention. FIG. 7B is a flowchart showing additional steps for generating a timing model with an IPR for each lower level functional block.

In step 805 of FIG. 7B, for each lower level functional block generated in step 705 (FIG. 7A), the netlist and the layout parasitic data for a lower level functional block are read from computer system memory (e.g., random access memory 102 of FIG. 1) using a known method.

In step 810 of FIG. 7B, in the present embodiment of the present invention, a search is made for an "interface node" such as an interface pin (e.g., interface pin 317 of FIG. 3 or interface pins 530 and 540 of FIG. 5).

When a new interface node is not found (that is, when all interface nodes have been considered in accordance with the steps shown in FIG. 7B), then step 710 is concluded (step 812). In this case, the layout parasitic data connected to the interface node of step 810 (that is, the IPR) is saved into the timing model for the lower level functional block presently being considered.

In step 815, in the present embodiment, when a new interface node is found (step 810), a search is made for the layout parasitic data connected to the interface node. If no such data are found, then a new interface node is searched for (step 810). If layout parasitic data are found for the interface node presently being considered, then that layout parasitic data are saved as raw parasitic data (step 820).

In step 825, in the present embodiment, a search is made for a timing arc from the interface node presently being considered. If no such timing arc is found, then a new interface node is searched for (step 810).

In step 830, when a timing arc from the present interface node is found, if the end point of that timing arc is an interface node, then the connection point for the layout parasitic data for this end of the timing arc is saved into the timing model for the lower level functional block (step 835). After saving, a new timing arc starting from the present node is searched for (step 825). If the end point of the timing arc is not an interface node, then a new timing arc is searched for (step 825) without saving the connection point.

Refer now to FIG. 7C, which provides additional details regarding steps 715, 720, and 725 (collectively referred to as block 714) of process 700. FIG. 7C is a flowchart showing steps for utilizing timing models with IPRs in a hierarchical timing analysis in accordance with one embodiment of the present invention.

In step 905 of FIG. 7C, the netlist and layout parasitic data for the higher level functional block (that is, the next highest functional block above the lower level functional blocks discussed with regard to FIG. 7B) are read from computer system memory (e.g., random access memory 102 of FIG. 1) using a known method.

In step 910 of FIG. 7C, a lower level functional block (e.g., functional block 310 of FIG. 3 or functional block 500 of FIG. 5) is searched for. If a new lower level functional block is not found, then the higher level functional block (comprising the lower level functional blocks found in step 910) is analyzed (step 912). The timing analysis uses the interface small nodes stored in the model for each transition according to the syntax described above (see discussion pertaining to FIG. 5), in order to accurately simulate the layout parasitics connected to interface nodes of lower level functional blocks.

In step 915 of FIG. 7C, if a lower level functional block is found, then the IPR (see step 812 of FIG. 7B) for that lower level functional block is read from computer system memory and connected to the layout parasitic data and the netlist for the higher level functional block.

In step 920 of FIG. 7C, the timing arcs for the lower level functional block are read from computer system memory. Return is then made to step 910 to find a new lower level functional block.

In summary, the present invention provides a method that preserves the raw layout parasitic data associated with the interface nodes of a lower level of a circuit (including, for example, the transistor level), and provides these raw layout parasitic data to the next higher level circuit in a hierarchical timing analysis. The raw layout parasitic data for the lower level are then connected with the netlist and the layout parasitic data for the next higher level, and the higher level circuit is then analyzed. It is appreciated that, relative to this higher level circuit, there may also be even higher level circuits, and in this case this higher level circuit is analogous to, and thus treated in a similar manner as, the lower level circuits described above.

In accordance with the present invention, the layout parasitics are uniformly modeled along a wire segment, for example, including the interface pins that connect timing models. Therefore, the overall accuracy of the timing analysis can be improved.

Thus, the present invention provides a method that addresses the modeling duality caused by the treatment of layout parasitic data at the lower and higher levels in a hierarchical timing analysis. The present invention also provides a method that can be utilized at the transistor level.

The preferred embodiment of the present invention, unified timing analysis for model interface layout parasitics, is thus described. While the present invention has been described in particular embodiments, it should be appreciated that the present invention should not be construed as limited by such embodiments, but rather construed according to the following claims.

What is claimed is:

1. A method for performing a hierarchical timing analysis of a circuit that for analysis is separated into a lower level block and a higher level block, said method comprising the steps of:
   isolating and storing first non-linear layout parasitic data associated with said lower level block;
   creating a first linear timing arc model of said lower level block without said first non-linear layout parasitic data;
   determining second non-linear layout parasitic data associated with said higher level block;
   using said first non-linear layout parasitic data, said second non-linear layout parasitic data, and said first linear timing arc model in a timing analysis of said higher level block, wherein said first non-linear layout parasitic data and said second non-linear layout parasitic data are uniformly modeled.

2. The method for performing a hierarchical timing analysis of a circuit as recited in claim 1 wherein said lower level block comprises one or more transistors.

3. The method for performing a hierarchical timing analysis of a circuit as recited in claim 1 wherein said first and second non-linear layout parasitic data are represented by resistors and capacitors.

4. The method for performing a hierarchical timing analysis of a circuit as recited in claim 1 wherein said first and second non-linear layout parasitic data are in a spf format.

5. The method for performing a hierarchical timing analysis of a circuit as recited in claim 1 wherein said lower level block is a transistor-level circuit representation.

6. The method for performing a hierarchical timing analysis of a circuit as recited in claim 1 wherein an interface point connects said lower level block and said higher level block, and wherein said interface point includes one of an interface pin and an internal node.

7. The method for performing a hierarchical timing analysis of a circuit as recited in claim 1 further comprising the steps of:
   isolating and storing third non-linear layout parasitic data associated with a second lower level block;
   creating a second linear timing arc model of said second lower level block without said third non-linear layout parasitic data associated with said second lower level block; and
   using said first non-linear layout parasitic data, said second non-linear layout parasitic data, said third non-linear layout parasitic data, said first linear timing arc model, and said second linear timing arc model in a timing analysis of said higher level block, wherein said first non-linear layout parasitic data said second non-linear layout parasitic data, and said third non-linear layout parasitic data are uniformly modeled.

8. A method for performing a hierarchical transistor-level timing analysis of a circuit having a transistor-level subcircuit, said method comprising the steps of:
   isolating and storing first non-linear data associated with said transistor-level subcircuit;
   creating a linear timing arc model of said transistor-level subcircuit without using said first non-linear data;
   determining second non-linear data associated with said circuit; and
   using said first non-linear data associated with said transistor-level subcircuit, said second non-linear data associated with said circuit, and said linear timing arc model of said transistor-level subcircuit in a timing analysis of said circuit, wherein said first non-linear data and said second non-linear data are uniformly modeled.

9. The method for performing a hierarchical timing analysis of a circuit having a transistor-level subdircuit as recited in claim 8 further comprising the step of:
   separating said transistor-level subcircuit from said circuit for analysis.

10. The method for performing a hierarchical timing analysis of a circuit having a transistor-level subcircuit as recited in claim 8 wherein said first non-linear data comprise layout parasitic data associated with said transistor-level subcircuit.

11. The method for performing a hierarchical timing analysis of a circuit having a transistor-level subcircuit as recited in claim 8 wherein said first and second non-linear data are in a spf format.

12. The method for performing a hierarchical timing analysis of a circuit having a transistor-level subcircuit as recited in claim 8 wherein said first and second non-linear data include layout parasitic data represented by resistors and capacitors.

13. The method for performing a hierarchical timing analysis of a circuit having a transistor-level subcircuit as recited in claim 8 wherein creating said linear timing arc model comprises:

generating a timing arc model without using layout parasitic data of said transistor-level subcircuit.

14. The method for performing a hierarchical timing analysis of a circuit having a transistor-level subcircuit as recited in claim 8 wherein an interface point connects said lower level block and said higher level block, and wherein said interface point includes one of an interface pin and an internal node.

15. A computer system comprising:

a bus;

a processor coupled to said bus;

a computer-readable memory unit coupled to said bus;

said processor for performing a method of hierarchical timing analysis of a circuit that is modeled as a lower level block and a higher level block, said method comprising the steps of:

isolating and storing in said memory unit first non-linear layout parasitic data associated with said lower level block;

creating a first linear timing arc model of said lower level block without said first non-linear layout parasitic data;

determining second non-linear layout parasitic data associated with said higher level block;

retrieving from said memory unit said first non-linear layout parasitic data associated with said lower level block;

using said first non-linear layout parasitic data, said second non-linear layout parasitic data, and said first linear timing arc model in a timing analysis of said higher level block, wherein said first non-linear layout parasitic data and said second non-linear layout parasitic data are uniformly modeled.

16. The computer system of claim 15 wherein said lower level block comprises one or more transistors.

17. The computer system of claim 15 wherein said first and second non-linear layout parasitic data are represented by resistors and capacitors.

18. The computer system of claim 15 wherein said first and second non-linear layout parasitic data are in a spf format.

19. The computer system of claim 15 wherein said lower level block is a transistor-level circuit representation.

20. The computer system of claim 15 wherein an interface point connects said lower level block and said higher level block, and wherein said interface point includes one of an interface pin and an internal node.

21. The computer system of claim 15 wherein said method further comprises the steps of:

isolating and storing third non-linear layout parasitic data associated with a second lower level block;

creating a second linear timing arc model of said second lower level block without said third non-linear layout parasitic data associated with said second lower level block; and using said first non-linear layout parasitic data, said second non-linear layout parasitic data, said third non-linear layout parasitic data, said first linear timing arc model, and said second linear timing arc model in a timing analysis of said higher level block, wherein said first non-linear layout parasitic data said second non-linear layout parasitic data, and said third non-linear layout parasitic data are uniformly modeled.

\* \* \* \* \*